US006730457B2

(12) United States Patent
Saraiya et al.

(10) Patent No.: US 6,730,457 B2
(45) Date of Patent: May 4, 2004

(54) DIGITAL WATERLESS LITHOGRAPHIC PRINTING PLATE HAVING HIGH RESISTANCE TO WATER-WASHABLE INKS

(75) Inventors: Shashikant Saraiya, Parlin, NJ (US); Xing Fu Zhong, Wallington, NJ (US); Jianbing Huang, Trumbull, CT (US); S. Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/190,066

(22) Filed: Jul. 5, 2002

(65) Prior Publication Data

US 2004/0005514 A1 Jan. 8, 2004

(51) Int. Cl.$^7$ .................................................. G03F 7/11
(52) U.S. Cl. ................. 430/273.1; 430/272.1; 430/284.1; 430/286.1; 430/302; 430/309; 430/434; 430/435; 430/494; 101/453; 101/463.1
(58) Field of Search ............... 430/435, 270.1, 430/271.1, 272.1, 273.1, 281.1, 284.1, 286.1, 287.1, 288.1, 302, 303, 309, 348, 401, 434, 494, 944, 945, 964; 101/453, 463.1, 465

(56) References Cited

U.S. PATENT DOCUMENTS

| 5,849,464 | A | | 12/1998 | Yokoya et al. ............... 430/303 |
| 5,919,600 | A | | 7/1999 | Huang et al. ............. 430/272.1 |
| 6,045,963 | A | * | 4/2000 | Huang et al. ................ 430/166 |
| 6,085,655 | A | | 7/2000 | Harris et al. |
| 6,096,476 | A | | 8/2000 | Yanagida et al. ......... 430/270.1 |
| 6,593,055 | B2 | | 7/2003 | Shimazu et al. |
| 6,656,661 | B2 | * | 12/2003 | Hong et al. ............. 430/272.1 |
| 6,660,453 | B2 | * | 12/2003 | Hirano et al. ............ 430/272.1 |
| 2002/0081529 | A1 | * | 6/2002 | Sonokawa ................... 430/303 |
| 2002/0146634 | A1 | * | 10/2002 | Hong et al. ................. 430/166 |

FOREIGN PATENT DOCUMENTS

| EP | 1 112 843 A2 | 7/2001 | ............. B41C/1/10 |
| EP | 1201425 | 5/2002 | |
| WO | WO 99/11467 | 3/1999 | |

* cited by examiner

Primary Examiner—Mark F. Huff
Assistant Examiner—Barbara Gilliam
(74) Attorney, Agent, or Firm—RatnerPrestia

(57) ABSTRACT

Thermally imageable elements and methods for their preparation and use are disclosed. The elements contain, in order, a substrate; an underlayer; and an ink-repellent layer. The underlayer contains a crosslinked allyl functional polyurethane. A photothermal conversion material is present in either in the underlayer or in an absorber layer between the underlayer and the ink-repellent layer. Thermal imaging and development removes the ink-repellent layer and reveals the underlayer in the exposed regions to form an imaged element useful as a waterless lithographic printing plate.

27 Claims, No Drawings

DIGITAL WATERLESS LITHOGRAPHIC PRINTING PLATE HAVING HIGH RESISTANCE TO WATER-WASHABLE INKS

FIELD OF THE INVENTION

The invention relates to imageable elements useful in lithographic printing. More particularly, this invention relates to thermally imageable elements useful as waterless lithographic printing plate precursors.

BACKGROUND OF THE INVENTION

Waterless or driographic lithographic printing, also known as dry planography, provides several advantages over conventional offset printing. Waterless lithographic printing is particularly advantageous for short run and on-press applications. It simplifies press design by eliminating the fountain solution and aqueous delivery train. Careful ink/water balance is unnecessary, thus reducing rollup time and material waste.

A waterless lithographic printing plate precursor comprises a layer of ink-repellent material over a support. During or after imaging, the ink-repellent layer is removed in the imaged regions to form an image. When the image is mounted on a press and used as a waterless lithographic printing plate, the regions in which the ink-repellent layer has been removed accept ink, which is then transferred to a suitable receiver, such as paper.

Preparation of a waterless printing plate involves the imagewise removal of the ink-repellent layer to reveal an underlying ink-accepting surface. Direct digital imaging, which obviates the need for exposure through a mask, is becoming increasingly important in the printing industry. For example, Huang, U.S. Pat. No. 5,919,600, incorporated herein by reference, discloses thermally imageable elements that comprise a substrate; a thermal imaging layer comprising a photothermal conversion material and a thermoplastic polyurethane with pendent allyl groups; and a crosslinked silicone polymer top layer. The thermal imaging layer has enhanced solubility in certain solvents when exposed to infrared radiation, but exhibits excellent adhesion to the silicone in unexposed regions so that the imaged regions can be removed with a suitable developer and the unexposed regions remain.

Despite the improvements made in thermally imageable waterless printing plate precursors, there continues to be a need for precursors with wide developer latitude and precursors that produce waterless printing plates that can be used with aggressive inks, such as ultraviolet and electron beam curable inks.

SUMMARY OF THE INVENTION

In one aspect, the invention is an imageable element useful as a waterless lithographic printing plate precursor. The element comprises, in order:
  a substrate;
  an underlayer; and
  an ink-repellent layer;
in which:
  the underlayer comprises a crosslinked allyl functional polyurethane;
  the element comprises a photothermal conversion material;
  the photothermal conversion material is either in the underlayer or in an absorber layer between the underlayer and the ink-repellent layer; and
  the ink-repellent layer comprises an ink-repellent polymer.

In another aspect, the invention is a method for forming an image useful as a waterless lithographic printing plate by imaging and developing the imageable element of the invention. In yet another aspect, the invention is an image useful as a waterless lithographic printing plate formed by imaging and developing the imageable element of the invention.

DETAILED DESCRIPTION OF THE INVENTION

Imageable Elements

The imageable element comprises, in order, a substrate, an underlayer, and an ink-repellent layer. A photothermal conversion material is present in the element, either in the underlayer or in a separate absorber layer between the underlayer and the ink-repellent layer. Other layers that are conventional in imageable elements useful as waterless lithographic printing plate precursors may be present.

Substrate

The substrate comprises a support, which may be any material conventionally used to prepare lithographic printing plates. The support is preferably strong, stable and flexible. It should resist dimensional change under conditions of use so that color records will register in a full-color image. Typically, it can be any self-supporting material, such as aluminum, zinc, titanium, and alloys thereof; paper; paper coated on one or both sides with an α-olefin polymer such as polyethylene; films such as cellulose acetate films, polyvinyl acetal films, polystyrene films, polypropylene films, polyester films such as polyethylene terephthalate films, polyamide films, polyimide films, nitrocellulose films, polycarbonate films, and polyvinylchloride films; composite films such as polyester, polypropylene or polystyrene films coated with polyethylene films; metalized papers or films; metal/paper laminates; and the like. The surface of plastic films may be treated using the surface treatment techniques known in the art to improve adhesion between the substrate and organic coatings.

The substrate may also comprise an antihalation compound or one or more sub coatings. Examples of subbing materials are adhesion-promoting materials, such as alkoxysilanes, aminopropyltriethoxysilane, glycidoxypropyltriethoxysilane and epoxy functional polymers, as well as conventional subbing materials used on polyester base in photographic films.

A preferred support is aluminum sheet. The surface of the aluminum may be treated by metal finishing techniques known in the art including brush roughening, electrochemical roughening, chemical roughening, anodizing, and silicate sealing and the like. If the surface is roughened, the average roughness Ra is preferably in the range from 0.1 to 0.8 μm, and more preferably in the range from 0.1 to 0.4 μm. The preferred thickness of the aluminum sheet is in the range from about 0.005 inch to about 0.020 inch.

The substrate may comprise a primer layer to, for example, prevent heat loss, especially when the support is a metal sheet, regulate ink receptivity, serve as a dye acceptor, if the developed plate needs to be dyed for visual image contrast enhancement, and/or to act as an adhesion promoter. The primer layer may be a thermoplastic coating, provided the coating is not soluble in the solvents used to coat the underlayer. Examples of thermoset coatings include polyester-melamine coatings, acrylic melamine coatings, epoxy coatings, and polyisocyanate coatings. An example of a thermoplastic coating is polyvinyl alcohol. When cured by ultraviolet radiation, the primer layer may be prepared from free radical polymerizable coatings, cationic crosslinkable coatings catalyzed by a photogenerated acid, or a diazo resin with suitable binders.

The back side of the substrate (i.e., the side opposite the underlayer) may be coated with an antistatic agent and/or a slipping layer or matte layer to improve handling and "feel" of the imageable element.

Underlayer

The underlayer is between the support and the ink-repellent layer. The underlayer comprises a crosslinked allyl functional polyurethane. Other ingredients that are conventional ingredients of these layers may also be present.

"Allyl functional polyurethane" refers to a thermoplastic polyurethane containing allyl groups, which may be either pendent or terminal allyl groups. The allyl functional polyurethane, before crosslinking, preferably has a glass transition temperature ($T_g$) of about 25° C. to about 130° C., more preferably about 30° C. to about 125° C., most preferably about 50° C. to about 125° C.

The allyl functional polyurethane may be prepared by reaction of a diisocyanate with an excess of an allyl functional diol to produce a solution of a thermoplastic polyurethane, followed by further reaction with a crosslinker, which reacts with the excess hydroxyl groups. The crosslinker is preferably added to the thermoplastic polyurethane solution less than about 30 minutes, preferably less than about 10 minutes, before the solution is applied to the substrate so that crosslinking does not interfere with application of the solution to the substrate. Alternatively, the allyl functional polyurethane may be prepared by reacting a diisocyanate with a carboxyl functional diol, such as dimethylol propionic acid. The carboxyl groups of the resulting polyurethane are then converted to into allyl ester groups by esterification with, for example, allyl alcohol.

Useful allyl functional diols have the general formula:

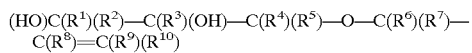
(HO)C($R^1$)($R^2$)—C($R^3$)(OH)—C($R^4$)($R^5$)—O—C($R^6$)($R^7$)—C($R^8$)=C($R^9$)($R^{10}$)

in which $R^1$ to $R^{10}$ are each individually hydrogen or an alkyl group, preferably hydrogen. Commercially available diols having an allyl groups include 3-allyloxy-1,2-propanediol and trimethylolpropane allyl ether. Other diols having an allyl ester group include allyl 4,4-bis-(hydroxyethyloxyphenyl)-pentanoate and allyl 2,2-bis (hydroxymethyl)propanoate. A preferred diol is 3-allyloxy-1,2-propanediol, in which all the R groups are hydrogen:

(HO)CH$_2$—CH(OH)—CH$_2$—O—CH$_2$—CH=CH$_2$

These allyl functional diols may be used alone or in combination; or further in combination with a diol that does not comprise the allyl functionality. Examples of useful diols not containing the allyl functionality that may be used in combination with an allyl functional diol or mixture of ally functional diols include ethylene glycol, diethylene glycol, polyethylene glycol, propylene glycol, polypropylene glycol, neopentyl glycol, 1,4-butanediol, and 1,6-hexanediol. When an allyl functional diol or mixture of allyl functional diols is used in combination with a diol that does not contain an allyl group or mixture of diols that do not contain the allyl group, the allyl functional diol or mixture of allyl functional diols typically comprises at least about 20 wt % of the diol mixture.

The crosslinked allyl functional polyurethane may also comprise acidic groups, i.e. groups with a $pK_a$ of 7 or less, such as sulfonic acid, phosphoric acid, phosphonic acid, or, preferably, carboxylic acid. They may be prepared by reaction of an excess of a mixture of allyl functional diol and a diol that comprises one or more acidic groups with a diisocyanate as described above. Useful diols that comprise one or more acidic groups include, for example, dialkanol alkyl sulfonic acids, dialkanol alkyl phosphoric acids, and dialkanol alkyl phosphonic acids.

Preferably, the crosslinked allyl functional polyurethane that comprises acidic groups is a crosslinked carboxyl, allyl functional polyurethane. Crosslinked carboxyl, allyl functional polyurethanes may be prepared by reaction of a diisocyanate with an excess of a mixture of allyl functional diol and a carboxyl functional diol to produce a solution of a thermoplastic polyurethane, followed by further reaction with a crosslinker as described above. Diol mixtures, as described above, may be used instead of a single allyl functional diol. When a mixture of an allyl functional diol and a carboxyl functional diol is used to prepare the thermoplastic polyurethane, the mixture typically contains about 15 wt % to about 25 wt % of the allyl functional diol and about 17 wt % to 23 wt % of the carboxyl functional diol, in addition to a diol or mixture of diols that does not have allyl or carboxyl functionality.

Useful carboxyl functional diols include, for example, dialkanol alkanoic acids, such as 2,2-bis(hydroxymethyl) propionic acid (2,2-dimethylol propanoic acid), 2,2-bis(2-hydroxyethyl) propionic acid, 2,2-bis(3-hydroxypropyl) propionic acid, bis(hydroxymethyl)acetic acid, bis(4-hydroxyphenyl)acetic acid, 2,2-bis(hydroxymethyl) butyric acid, 2,2-bis(hydroxymethyl) pentanoic acid, and tartaric acid; dihydroxybenzoic acids such as 3,5-dihydroxybenzoic acid; and dihydroxy dicarboxylic acids derived by reaction of dianhydrides with diols, such as the reaction product of a dianhydride such as pyromellitic dianhydride, 3,3',4,4'-benzophenone tetracarboxylic dianhydride, 3,3',4,4'-diphenyl tetracarboxylic dianhydride, or 2,3,6,7-naphthalene tetracarboxylic dianhydride with a diol such as ethylene glycol, diethylene glycol, triethylene glycol, polyethylene glycol, 1,2- or 1,3-propanediol, polypropylene glycol, 1,2- or 1,4-butanediol, neopentyl glycol, or 1,6-hexanediol.

Aromatic and/or aliphatic diisocyanates may be used to form the polyurethane. Aromatic diisocyanates include, for example, 2,4-toluene diisocyanate, 2,6-toluene diisocyanate, p-xylene diisocyanate, m-xylene diisocyanate, tetramethylxylene diisocyanate, 4,4-diphenylmethane diisocyanate, 1,5-naphthalene diisocyanate, and 3,3'-dimethylbiphenyl-4, 4'-diisocyanate. Aliphatic diisocyanates include, for example, hexamethylene diisocyanate, trimethylhexamethylene diisocyanate, isophorone diisocyanate, 4,4-methylene-bis(cyclohexyl isocyanate), methylcyclohexane-2,4- and 2,6-diisocyanate, and 1,4-bis(isocyanatomethyl) cyclohexane. Aromatic diisocyanates are preferred.

The crosslinker may be any crosslinker that reacts with hydroxyl groups. When a carboxyl, allyl functional polyurethane is used, the crosslinker may be any crosslinker that reacts with hydroxyl groups and/or carboxyl groups. When the allyl functional polyurethane contains only two groups that will react with the crosslinker, the crosslinker used should comprise at least three reactive groups. When the ally functional polyurethane contains more than two groups that will react with the crosslinker, the crosslinker used should comprise at least two, and preferably at least three, reactive groups.

Useful crosslinkers include, for example, amino resins with activated ether/alcohol groups, such as formylated, alkoxylated melamine resins; phenolic resins with activated ether/alcohol groups, such as resole resins; polyfunctional epoxides; polyfunctional arizidines, such as trimethylolpropane-tris-(β-(N-aziridinyl)propionate) (XAMA®-2), pentaerythritol-tris-(β-(N-aziridinyl) propionate) (XAMA®-7) and NEOCRYL® CX-100; and polyfunctional isocyanates, such as those sold under the DESMODUR® tradename, for example, DESMODUR® N-100, DESMODUR® MP-100, DESMODUR® N 3200, DESMODUR® N 3300, and DESMODUR® N 3600. Polyfunctional isocyanates are a preferred group of crosslinkers.

Typically these materials are mixed with the polyurethane just prior to application of the mixture to the support. Crosslinking may take place at ambient temperature, or the mixture may be heated to enhance crosslinking. Crosslinkers that crosslink at ambient temperature are preferred.

The underlayer may comprise other ingredients, such as dyes and surfactants, that are conventional ingredients of imageable elements. The underlayer may comprise a dye to aid in the visual inspection of the exposed and/or developed element. Printout dyes distinguish the exposed regions from the unexposed regions during processing. Contrast dyes distinguish the unimaged regions from the imaged regions in the developed imageable element. Triarylmethane dyes, such as ethyl violet, crystal violet, malachite green, brilliant green, Victoria blue B, Victoria blue R, and Victoria pure blue BO, may act as a contrast dyes.

Photothermal Conversion Material

The element comprises a photothermal conversion material. The photothermal conversion material may be present in the underlayer or in a separate absorber layer between the underlayer and the ink-repellant layer. To minimize ablation during imaging, preferably the ink-repellent layer is substantially free of photothermal conversion material.

Photothermal conversion materials absorb radiation and convert it to heat. Photothermal conversion materials may absorb ultraviolet, visible, and/or infrared radiation and convert it to heat. Although the polyurethane may comprise an absorbing moiety, i.e., be a photothermal conversion material, typically the photothermal conversion material is a separate compound.

Useful infrared absorbing compounds typically have a maximum absorption wavelength ($\lambda_{max}$) in some part of the electromagnetic spectrum greater than about 750 nm, that is in the infrared region and near infrared region of the spectrum. More particularly, they should have high absorptivity in the region used for imaging, typically from about 780 nm to about 1300 nm and, more typically, from about 800 nm to about 1100 nm.

The photothermal conversion material may be either a dye or pigment. Useful classes of materials include, for example, triarylamine, thiazolium, indolium, oxazolium, polyaniline, polypyrrole, polythiophene, squarilium, crotonate, cyanine, phthalocyanine, merocyanine, chalcogenopyryloarylidine, bis(chalcogenopyrylo)polymethine, oxyindolizine, quinoid, indolizine, and pyrylium dyes and pigments, as well as thiolene metal complexes (e.g. metal dithiolene) dyes and pigments. Other useful classes include thiazine, azulenium and xanthene dyes and dark inorganic pigments. Examples of absorbing pigments are Projet 900, Projet 860 and Projet 830 (all available from the Zeneca Corporation), and carbon black.

Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and IR Dyes A and B, whose structures are shown below.

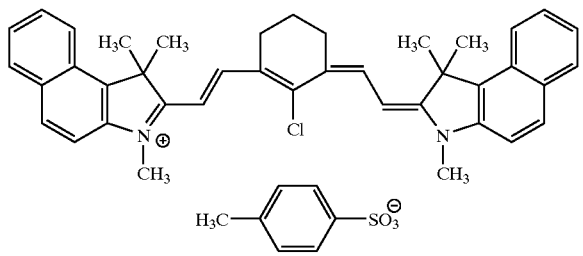

IR Dye A

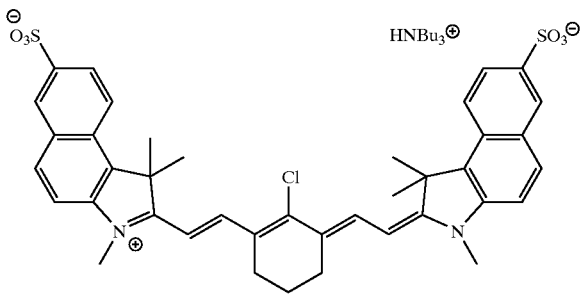

IR Dye B

The amount of photothermal conversion material in the element is generally sufficient to provide an optical density of at least 0.05, and preferably, an optical density of from about 0.5 to about 3 at the imaging wavelength. As is well known to those skilled in the art, the amount of an absorber required to produce a particular optical density can be determined from the thickness of the layer and the extinction coefficient of the absorber at the wavelength used for imaging using Beers law.

Absorber Layer

The photothermal conversion material may be present in an absorber layer, which is between the ink-repellent layer and the underlayer. When the absorber layer is present, the underlayer typically does not comprise a photothermal conversion material.

The absorber layer typically consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of the polyurethane used in the underlayer and the polymer used in the ink-repellent layer. The surfactant may be present to help disperse the photothermal conversion material in a coating solvent.

The thickness of the absorber layer is generally sufficient to absorb at least 90%, preferably at least 95%, of the imaging radiation. As is well known to those skilled in the art, the amount of absorber required to absorb a particular amount of radiation can be determined from the thickness of the absorber layer and the extinction coefficient of the absorber at the imaging wavelength using Beers law. Typically the absorber layer has a coating weight of about 0.02 $g/m^2$ to about 2 $g/m^2$, preferably about 0.05 $g/m^2$ to about 1.5 $g/m^2$.

Ink-Repellent Layer

The ink-repellent layer is over the underlayer. When an absorber layer is present, the absorber layer is between the ink-repellent layer and the underlayer.

The ink-repellent layer comprises a low surface energy material that repels ink, such as a fluorine compound or a silicone compound. Crosslinked silicone polymers are preferred. The ink-repellent layer may comprise a crosslinked siloxane polymer comprising the following repeat units:

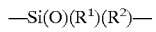

in which each $R^1$ and $R^2$ is independently a monovalent alkyl, aryl or alkenyl group. Each $R^1$ and $R^2$ may contain functional substituent groups such as hydroxyl, halogen, amino, alkoxy, aryloxy, (meth)acryloxy, and thiol. At least half of the $R^1$ and $R^2$ groups should be methyl when a mixture of R groups is used. Preferably, all the groups except the groups that are used to form the crosslinks, are methyl groups.

Silicone polymers can be crosslinked by three different methods: (1) by a condensation reaction, (2) by an addition reaction, or (3) by radiation curing. Any of these methods can be used to prepare the crosslinked silicone polymer in the ink-repellent layer. Condensation and addition are preferred.

Condensation type silicone rubbers are formed by a condensation reaction. Typically a polydimethylsiloxane with terminal silanol (—Si—OH) groups is crosslinked by a crosslinking agent in the presence of a catalyst such as an organic tin compound or an organic titanium compound. The crosslinking agent typically has the following structure:

in which: m+n=4, n is at least 2, R is an alkyl group or an aryl group, and X is Cl or Br.

Addition type silicone rubbers are produced by the addition of an Si—H group to a double bond by hydrosilylation. Typically a vinyl-substituted siloxane polymer and a silicone compound having plural Si—H groups reacted together in the presence of a catalyst. The vinyl groups in the siloxane polymer may be randomly distributed along the polymeric chain, or located at the chain ends. Typical catalysts are elemental platinum, platinum chloride, chloroplatinic acid and platinum coordinated with olefins. To improve pot-life, volatile inhibitors such as ketones, alcohols and alkynes, such as those disclosed in Hockemeyer, U.S. Pat. No. 4,184,006, may be added. These alkynes include, for example, 2-methyl-3-butyne-2-ol, ethynylcyclohexanol, 2-butyne, 2-methyl-but-1-en-3-yne, and phenyl acetylene.

Radiation curing type silicone rubber is prepared by crosslinking a silicone polymer having functional groups polymerizable by radiation. Typically a polymer having acrylic functional groups is crosslinked by ultraviolet irradiation to produce the radiation curing type silicone rubber.

The ink-repellent layer may comprise pigments and fillers such as silica, calcium carbonate, and titanium oxide. To improve the adhesion of the ink-repellent layer to the adjacent layers, adhesion improvers may be added to the coating solution for the ink-repellent layer. Titanium coupling agents such as polytetrabutyl titanate and polytetraisopropyl titanate may be used as adhesion improvers.

The coating weight of the ink-repellant layer is typically about 0.2 to about 10 $g/m^2$, and preferably about 1.0 to about 3.0 $g/m^2$. The thickness of the ink-repellant layer is typically about 0.3 µm to about 20 µm, preferably from about 0.5 µm to about 10 µm, and more preferably about 0.7 µm to about 3 µm.

Additional Layers

The imageable element may comprise one or more additional layers, for example, to improve interlayer adhesion, to reduce halation effects, and/or to improve printing surface characteristics. Typical additional layers include, for example, protective layers over the ink-repellent layer, and adhesion promotion layers between the underlayer and the substrate.

An adhesion promotion layer may be between the ink-repellent layer and the underlayer. Preferred adhesion promoters are aminosilanes of the general formula

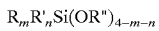

where R is unsubstituted or mono-substituted amino-alkyl, R' and R" are each alkyl or aryl, m is 1 or 2, and n is 0 or 1, m+n being equal to 1 or 2. Specific examples of such aminosilanes are y-aminopropyltriethoxysilane and γ-[N-(2-aminoethyl)amino]propyl trimethoxysilane.

An optional protective layer may be over the ink-repellant layer to protect the surface of the ink-repellent layer during storage and handling. Typically the protective layer is a thin polymeric film, for example a polyester film such as a polyethylene terephthalate film, or a polyolefin film such as a polyethylene film or a polypropylene film. The protective layer is designed to be easily removed, either prior to imaging or processing, without damaging the surface of the ink-repellant layer.

Preparation of the Imageable Elements

The thermally imageable element may be prepared by sequentially applying the underlayer over the surface of the substrate, applying the absorber layer, if present, over the underlayer, and applying the ink-repellant layer over the absorber layer, if the absorber layer is present, or over the underlayer, if the absorber layer is not present, using conventional coating and/or lamination methods. If present in the imageable element, an adhesion promotion layer may also be formed by these techniques. If desired, a protective layer may be laminated over the ink-repellent layer.

The underlayer may be applied over the substrate by any conventional method. Typically the ingredients are dispersed or dissolved in a suitable coating solvent, and the resulting mixture coated by conventional methods, such as spin coating, bar coating, gravure coating, or roller coating. The term "coating solvent" includes mixtures of solvents, especially mixtures of organic solvents. Some of materials, such as pigments, may be dispersed rather than dissolved in the coating solvent.

As described above, typically the allyl functional polyurethane is prepared by reaction of a diisocyanate with an excess of an allyl functional diol to produce a solution of a thermoplastic polyurethane, followed by further reaction with a crosslinker. The crosslinker is preferably added to the thermoplastic polyurethane solution less than about 30 minutes, preferably less than about 10 minutes, before the solution is applied to the substrate so that crosslinking does not interfere with application of the solution to the substrate.

If present, the absorber layer may be applied over the underlayer by any conventional method, such as those listed above.

The ink-repellent layer is coated over the underlayer or over the absorber layer if present, or over the adhesion layer if present. For a condensation type or addition type silicone rubber, a coating solution prepared by dissolving the appropriate uncrosslinked silicone polymer, a crosslinking agent and a catalyst is applied and heated, which causes the crosslinking reaction to form the crosslinked silicone polymer. For a radiation curing type silicone rubber, a solution comprising the appropriate uncrosslinked silicone polymer and an initiator is used as a coating solution. The resulting coating is exposed to radiation to form the layer of crosslinked silicone polymer.

If desired, a protective layer, typically a polymer film as described above, may be laminated over the ink-repellant layer.

Imaging and Processing

The imageable elements may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging thermally imageable elements. Imaging is conveniently carried out with a laser emitting at about 830 nm or at about 1064 nm. Suitable commercially available imaging devices include image setters such as the Creo Trendsetter (CREO, British Columbia, Canada) and the Gerber Crescent 42T (Gerber). If a protective layer is present, it is typically removed before imaging.

Imaging produces an imaged element, which comprises a latent image of exposed (imaged) regions and unexposed (unimaged) regions. Development of the imaged element to form a waterless lithographic printing plate, or printing form, converts the latent image to an image by removing the ink-repellent layer in the imaged regions, revealing the crosslinked allyl functional polyurethane in the underlying underlayer. Neither the ink-repellent layer nor the underlayer is removed in the unimaged regions.

The developer may be any liquid or solution that can remove the imaged regions of the ink-repellent layer, without substantially affecting either the underlayer, in either the imaged or unimaged regions, or the unimaged regions of the ink-repellant layer. A group of preferred developers are glycol ethers, more preferably propylene glycol ethers, especially tripropylene glycol n-butyl ether. Because the imageable elements have wide developer latitude, especially with glycol developers that contain varying amounts of water, it is not necessary to carefully control the amount of water in the developer. The developer may also be diluted with liquids such as polypropylene glycol and aliphatic hydrocarbon solvents.

Typically the developer is applied to the imaged element by rubbing or wiping the ink-repellent layer with an applicator containing the developer. It is believed that the developer penetrates the imaged regions ink-repellent layer and the wiping action physically removes the imaged regions of the ink-repellent layer. Alternatively the imaged element may be brushed with the developer or the developer may be applied to the imaged element by spraying the ink-repellent layer with sufficient force to remove the imaged regions of the ink-repellent layer. In either instance a waterless printing plate is produced, which has imaged regions of the underlayer that are ink receptive and complementary unimaged areas of the ink-repellent layer which are ink repellent. The developer may be applied at ambient temperature or at elevated temperatures over the range from about 25° C. to about 50° C. Preferably, the developer is applied at a temperature between about 35° C. to about 40° C.

Once the imageable element has been imaged and developed, printing can then be carried out by applying a lithographic ink to the image on its surface. No fountain solution is used. The ink is taken up by the imaged (exposed) regions, i.e., the surface of the underlayer revealed by imaging and developing steps. The ink is then transferred to a suitable receiving material (such as cloth, paper, metal, glass or plastic) either directly or indirectly through the use of an offset printing blanket to provide a desired impression of the image thereon.

Industrial Applicability

The imageable elements are useful for the preparation of waterless lithographic printing plates. They have wide developer latitude, especially with glycol developers that contain varying amounts of water. In addition, the element produces a waterless printing plate that can be used with aggressive inks, such as ultraviolet and electron beam curable inks.

The advantageous properties of this invention can be observed by reference to the following examples, which illustrate but do not limit the invention.

EXAMPLES

Glossary

ADS-IR 830    Infrared absorbing dye (American Dye Source,

-continued

Glossary

| | |
|---|---|
| | Montreal, Canada) |
| DESMODUR ® N-3300 | Isocyanurate triisocyanate (Bayer) |
| DOWANOL ® TPNB | Tripropyleneglycol-n-butyl ether (Dow Chemical, Midland, MI USA) |
| ISOPAR ® E | Isoparafin solvent, boiling point 116–128° C. (Exxon Mobil Chemical) |
| MDI | 4,4'-Methylene-bis-(phenylisocyanate) |
| PC-075 | Platinum Catalyst (United Chemical Technologies, Bristol, PA USA) |
| PS 255 | Silicone gum with 0.1–0.3% vinyl functionality randomly distributed along a polydimethyl siloxane main chain (United Chemical Technologies, Bristol, PA USA) |
| SL-6020 | Hydromethyl siloxane polymer (General Electric) |
| SL-6040 | Volatile inhibitor (General Electric) |

Example 1

This example describes the preparation of an allyl-functional polyurethane resin from MDI and 3-allyloxy-1,2-propanediol. The MDI to 3-allyloxy-1,2-propanediol molar ratio was 1.00:1.05.

N-Methylpyrrolidone (120 g) and acetone (437.5 g) were charged into a four-necked 2-L flask fitted with a heating mantle, temperature controller, mechanical stirrer, condenser, pressure-equalized addition funnel and nitrogen inlet. Then MDI (258.8 g) (1.016 mol) was added slowly with stirring at room temperature. After 10 min, the reaction mixture was heated to 60° C. and 3-allyloxy-1,2-propanediol (141.19g) (1.067 mol) was added over 1 hr while the reaction mixture was maintained at gentle reflux. The reaction mixture was heated at reflux for an additional 2 hr. After the amount of isocyante was reduced to 2.80±0.10%, a mixture of dibutyltin dilaurate (1.95 g) in acetone (40.7 g) was added over 30 min. Completion of the reaction was determined by the disappearance of the isocyanate infrared absorption band at 2275 cm$^{-1}$. The resulting clear solution had a kinematic viscosity of E (Gardner-Holt) at 40% non-volatiles.

The allyl-functional polyurethane resin was precipitated in powder form by addition of a mixture of water (9.0 kg) and ice (3.0 kg) with stirring, using a Silverston Model #L4RT-A multi-purpose high shear laboratory mixer at 6000 rpm. The mixture was stirred at 4000 rpm for about 10 to 15 min using a Series 2000, Model #84, Laboratory Dispersator. The allyl-functional polyurethane resin was filtered off and dried at 60° C. in a drying oven. $T_g$=88° C.

Example 2

This example describes the preparation of an allyl, carboxy-functional polyurethane resin from MDI, 3-allylloxy-1,2-propanediol, and 2,2-dimethylol propanoic acid. The MDI to 3-allylloxy-1,2-propanediol to 2,2-dimethylol propanoic acid molar ratio was 1.00:0.50:0.55.

N,N-Dimethylacetamide (352.1 g) was charged into a four-necked 1-L flask fitted with a heating mantle, temperature controller, mechanical stirrer, condenser, pressure-equalized addition funnel and nitrogen inlet. Then MDI (150.4 g) (0.6 mol) was added slowly with stirring at room temperature. After 10 min, 2,2-dimethylol propanoic acid (40.2 g) (0.3 mol) was added at ambient temperature. The temperature of the reaction mixture increased to 57° C. Then 3-allylloxy-1,2-propanediol (43.6 g) (0.33 mol) was added over 30 min. The reaction mixture was stirred for an additional 2 hr. Completion of the reaction was determined by the disappearance of the isocyanate infrared absorption band at 2275 cm$^{-1}$. The resulting clear solution had a kinematic viscosity of $Z_1$ (Gardner-Holt) at 40% non-volatiles.

The carboxyl, allyl-functional polyurethane resin was precipitated in powder form and dried as in Example 1. $T_g$=113° C.

Example 3

This example illustrates the use of an uncrosslinked allyl-functional polyurethane resin in the underlayer of the imageable element.

Underlayer. A solution of the allyl-functional polyurethane resin prepared in Example 1 (9.9 g) and ADS-IR 830 (1.1 g) in 2-butanone (189 g) was spin coated onto a aluminum substrate. The aluminum substrate had been electrochemically grained, anodized, and treated with an aqueous solution of polyvinyl phosphonic acid. The resulting element was dried at about 46° C. for 4 min. The coating weight of the underlayer was 1.0 g/m$^2$.

Ink-Repellent Layer. A solution of PS-255 (39.9 g), SL-6020 (0.3 g), PC-075 (0.1 g), and SL-6040 (0.1 g) in ISOPAR® E was spin coated onto the underlayer. The resulting imageable element was heated at about 46° C. for 4 min and cured at 95° C. for 3 min and at 130° C. for 1 min through a heated conveyor. The coating weight of the ink-repellant layer was 2.0 g/m$^2$.

Imaging and Processing. The imageable element was imaged with 830 nm radiation using a Creo Trendsetter 3224 (CREO Corp., British Columbia, Canada) with a power setting of 10.5 W and an imaging energy of 200 mJ/cm$^2$. The resulting imaged imageable element was machine processed with DOWANOL® TPNB using a Toray-TWL-860 KII waterless plate processor at 35-40° C. and 275 rpm to form a waterless lithographic printing plate. The underlayer and overlying silicone layer were cleanly removed in the exposed regions to form the ink-receiving, image areas. The underlayer and overlying silicone layer remained in the unexposed regions to form the ink-repelling, non-image areas.

Evaluation. The printing plate was mounted in a R&P H-125 sheet-fed press and evaluated using Sun Chemical Drylith cyan ink. More than 50,000 clean, high-resolution impressions were produced.

Developer Latitude. Developer latitude was evaluated by processing imaged imageable elements in developer to which water had been added. When greater than 1.4% by weight of water was added, the unexposed regions were attacked by the developer. When 5% water was added to the developer, both the exposed and unexposed regions were removed.

Ink Resistance. Water-washable litho inks attacked the non-image areas. The non-image areas were particularly sensitive to water-washable litho inks, including ultraviolet and electron beam curable inks.

Example 4

Underlayer. A solution of the allyl-functional polyurethane resin prepared in Example 1 (7.15 g), ADS-IR 830 (1.0 g), and DESMODUR® N-3300 (1.86 g) in 2-butanone (189 g) was spin coated onto the aluminum substrate of Example 3 and dried as in Example 3. The DESMODUR® N-3300 was added less than 10 min before the solution was spin coated onto the aluminum substrate. The coating weight of the underlayer was 1.0 g/m².

Ink-Repellent Layer. The ink-repellent layer was spin coated onto the underlayer as described in Example 3. The coating weight of the ink-repellant layer was 2.0 g/m².

Imaging and Processing. The imageable element was imaged and the resulting imaged imageable element processed as described in Example 3. The developer cleanly removed the ink-repellant layer in the exposed regions to produce a waterless lithographic printing plate. The underlying regions of the underlayer, which comprise a crosslinked polyurethane, remained as the ink-receiving areas. The developer did not attack the unexposed regions.

Developer Latitude. High-resolution images were obtained when an imaged imageable element was developed with a developer that contained 5% by weight water.

Ink Resistance. The image had high resistance to water-washable litho inks, including ultraviolet and electron beam curable inks.

Example 5

The procedure of Example 4 was repeated except that the coating solution for the underlayer contained 7.97 g of the allyl-functional polyurethane resin prepared in Example 1, 1.0 g of ADS-IR 830, and 1.035 g of DESMODUR® N-3300. The DESMODUR® N-3300 was added less than 10 min before the solution was spin coated onto the aluminum substrate. The coating weight of the underlayer was 1.0 g/m².

Developer latitude and resistance to water-washable litho inks for the resulting image were similar to those for the image formed in Example 4.

Example 6

The procedure of Example 4 was repeated except that the coating solution for the underlayer contained the allyl, carboxyl-functional polymer prepared in Example 2. The DESMODUR® N-3300 was added less than 10 min before the solution was spin coated onto the aluminum substrate. The coating weight of the underlayer was 1.0 g/m².

The developer cleanly removed the ink-repellent layer in the imaged regions to provide a high resolution printing plate. The underlying underlayer, which comprises the crosslinked the allyl, carboxyl-functional polymer remained in the imaged as the ink-receiving areas. Both the ink-repellent layer and the underlayer remained in the unimaged regions.

Developer latitude and resistance to water-washable litho inks for the resulting image were similar to those for the image formed in Example 4.

Having described the invention, we now claim the following and their equivalents.

What is claimed is:

1. An imageable element comprising, in order:
   a substrate;
   an underlayer; and
   an ink-repellent layer;
   in which:
   the underlayer comprises a crosslinked allyl functional polyurethane;
   the element comprises a photothermal conversion material;
   the photothermal conversion material is either in the underlayer or in an absorber layer between the underlayer and the ink-repellent layer; and
   the ink-repellent layer comprises an ink-repellent polymer.

2. The element of claim 1 in which the ink-repellent polymer is a crosslinked silicone polymer.

3. The element of claim 2 in which the photothermal conversion material is in the underlayer, and the element does not comprise an absorber layer.

4. The element of claim 3 in which the crosslinked allyl functional polyurethane, before crosslinking, has a glass transition temperature of about 25° C. to about 130° C.

5. The element of claim 4 in which the crosslinked allyl functional polyurethane is crosslinked by a polyfunctional isocyanate.

6. The element of claim 2 in which the photothermal conversion material is in the absorber layer.

7. The element of claim 6 in which the crosslinked allyl functional polyurethane, before crosslinking, has a glass transition temperature of about 25° C. to about 130° C.

8. The element of claim 7 in which the crosslinked allyl functional polyurethane is crosslinked by a polyfunctional isocyanate.

9. The element of claim 2 in which the crosslinked allyl functional polyurethane additionally comprises an acidic group.

10. The element of claim 9 in which the acidic group is a carboxyl group.

11. The element of claim 10 in which the photothermal conversion material is in the underlayer, and the element does not comprise an absorber layer.

12. The element of claim 10 in which the photothermal conversion material is in the absorber layer.

13. A method for forming an image, the method comprising the steps of:
   a) imaging an imageable element and forming imaged regions and unimaged regions in the imageable element, the imageable element comprising:
      a substrate;
      an underlayer; and
      an ink-repellent layer;
      in which:
      the underlayer comprises a crosslinked allyl functional polyurethane;
      the element comprises a photothermal conversion material;
      the photothermal conversion material is either in the underlayer or in an absorber layer between the underlayer and the ink-repellent layer; and
      the ink-repellent layer comprises an ink-repellent polymer; and
   b) developing the imaged imageable element with a developer and removing the ink-repellent layer and revealing the underlayer in the imaged regions and not removing the ink-repellent layer in the complementary unimaged regions.

14. The method of claim 13 in which the ink-repellent polymer is a crosslinked silicone polymer.

15. The method of claim 14 in which the developer comprises a glycol ether.

16. The method of claim 14 in which the photothermal conversion material is in the underlayer, and the element does not comprise an absorber layer.

17. The method of claim 16 in which the developer comprises a propylene glycol ether.

18. The method of claim 14 in which the photothermal conversion material is the absorber layer.

19. The method of claim 18 in which the developer comprises a propylene glycol ether.

20. The method of claim 14 in which the crosslinked allyl functional polyurethane additionally comprises an acidic group.

21. The method of claim 20 in which the acidic group is a carboxyl group.

22. The method of claim 21 in which the photothermal conversion material is in the underlayer, and the element does not comprise an absorber layer.

23. The method of claim 22 in which the developer comprises a propylene glycol ether.

24. The method of claim 21 in which the photothermal conversion material is in the absorber layer.

25. The method of claim 24 in which the developer comprises a propylene glycol ether.

26. A lithographic printing plate prepared by the method of claim 13.

27. The lithographic printing plate of claim 26 in which the ink-repellent polymer is a crosslinked silicone polymer.

* * * * *